US012424533B2

(12) United States Patent
Barkow et al.

(10) Patent No.: US 12,424,533 B2
(45) Date of Patent: Sep. 23, 2025

(54) POWER SEMICONDUCTOR MODULE

(71) Applicant: Dr. Ing. h.c. F. Porsche Aktiengesellschaft, Stuttgart (DE)

(72) Inventors: Maximilian Barkow, Stuttgart (DE); Patrick Fuchs, Leonberg (DE); Timijan Velic, Weissach (DE); Bernd Eckardt, Erlangen (DE); Maximilian Hofmann, Erlangen (DE); Hubert Rauh, Erlangen (DE); Andre Mueller, Erlangen (DE); Benjamin Bayer, Erlangen (DE); Jordan Sorge, Erlangen (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 378 days.

(21) Appl. No.: 18/302,825

(22) Filed: Apr. 19, 2023

(65) Prior Publication Data
US 2023/0343688 A1   Oct. 26, 2023

(30) Foreign Application Priority Data

Apr. 22, 2022   (DE) .......................... 102022109792.7

(51) Int. Cl.
*H01L 23/498*  (2006.01)
*H01L 23/538*  (2006.01)
*H01L 25/065*  (2023.01)

(52) U.S. Cl.
CPC .. *H01L 23/49827* (2013.01); *H01L 23/49811* (2013.01); *H01L 23/5385* (2013.01); *H01L 25/0655* (2013.01)

(58) Field of Classification Search
CPC ......... H01L 23/49827; H01L 23/49811; H01L 23/5385; H01L 25/0655
(Continued)

(56) References Cited

U.S. PATENT DOCUMENTS 10,147,665 B2     12/2018  Park et al.
10,186,477 B2 *   1/2019   Gowda ................... H01L 24/83
(Continued)

FOREIGN PATENT DOCUMENTS

DE       102011083223 A1    3/2013
DE       102017213053 A1    6/2018

*Primary Examiner* — Tu-Tu V Ho
(74) *Attorney, Agent, or Firm* — LEYDIG, VOIT & MAYER, LTD.

(57) ABSTRACT

A power semiconductor module includes a first and second insulating substrate, which is arranged parallel to and at a distance from the first insulating substrate. The first insulating substrate and the second insulating substrate each include an insulating layer, an inner metallization layer, and an outer metallization layer. The power semiconductor module also includes a first cooling device, which is arranged thermally conductively on the outer metallization layer of the first insulating substrate, a second cooling device, which is arranged thermally conductively on the outer metallization layer of the second insulating substrate. The power semiconductor module also includes a power semiconductor, arranged between the first insulating substrate and the second insulating substrate. At least one of the two insulating substrates include a through-contact, by which the inner metallization layer of the corresponding insulating substrate is electrically connected to the outer metallization layer of the corresponding insulating substrate.

7 Claims, 2 Drawing Sheets

(58) Field of Classification Search
USPC .......................................................... 257/712
See application file for complete search history.

(56) References Cited

U.S. PATENT DOCUMENTS

| | | |
|---|---|---|
| 2009/0116197 A1 | 5/2009 | Funakoshi et al. |
| 2013/0075932 A1 | 3/2013 | Schwarzer et al. |
| 2013/0328200 A1 | 12/2013 | Bae |
| 2017/0162481 A1 | 6/2017 | Lin et al. |
| 2017/0287875 A1 | 10/2017 | Gao et al. |

* cited by examiner
POWER SEMICONDUCTOR MODULE

CROSS REFERENCE TO RELATED APPLICATIONS

This application claims benefit to German Patent Application No. DE 10 2022 109 792.7, filed on Apr. 22, 2022, which is hereby incorporated by reference herein.

FIELD

The invention relates to a power semiconductor module.

BACKGROUND

Power semiconductor modules are well known in the prior art, for example from DE 10 2017 213 053 A1, and are used for example in power converters, in particular inverters, as well as in drive electronics of electric motors in order to switch a relatively high electrical power. Often, such power semiconductor modules comprise a plurality of power semiconductor elements which are interconnected in a so-called (half-)bridge circuit. The particular interconnection of the individual power semiconductor elements, and of other components of the power semiconductor module which are typically present, is in this case generally achieved by means of corresponding structuring of the inner metallization layer of the first insulating substrate and of the inner metallization layer of the second insulating substrate, electrically nonconductive regions being deliberately generated in the essentially electrically conductive metallization layers by corresponding processing, typically by local erosion of the metallization layer.

The power semiconductor elements of the power semiconductor module become heated during operation, typically relatively strongly, for which reason sufficient cooling of the power semiconductor elements is crucial in order, on the one hand, to ensure efficient operation of the power semiconductor module and, on the other hand, to avoid damaging the power semiconductor module. Against this background, the power semiconductor module of the type in question comprises two cooling devices, by means of which the power semiconductor module is cooled on two sides.

In general, the electrically nonconductive regions generated by the structuring of the metallization layers are also thermally nonconductive, so that the design flexibility in the structuring of the metallization layers is restricted. In particular, the structuring needs to be configured in such a way that there are sufficiently large electrically conductive and therefore also thermally conductive regions in order to ensure sufficient cooling of the power semiconductor elements.

In order to allow the particular interconnection of the power semiconductor elements on the one hand, and in order to ensure sufficient cooling of the power semiconductor elements on the other hand, relatively large insulating substrates having correspondingly large-area metallization layers are therefore typically necessary.

SUMMARY

In an embodiment, the present disclosure provides a power semiconductor module comprising a first insulating substrate, and a second insulating substrate, which is arranged parallel to the first insulating substrate and at a distance from the first insulating substrate. The first insulating substrate and the second insulating substrate each comprise an insulating layer, an inner metallization layer which is arranged on an inner side, facing toward an other respective insulating substrate, of the insulating layer, and an outer metallization layer which is arranged on an outer side, facing away from the other respective insulating substrate, of the insulating layer. The power semiconductor module also comprises a first cooling device, which is arranged thermally conductively on the outer metallization layer of the first insulating substrate, a second cooling device, which is arranged thermally conductively on the outer metallization layer of the second insulating substrate, and a power semiconductor, which is arranged between the first insulating substrate and the second insulating substrate and is electrically and thermally connected to the inner metallization layer of the first insulating substrate and to the inner metallization layer of the second insulating substrate. At least one of the two insulating substrates comprise a through-contact, which extends through the insulating layer of a corresponding insulating substrate and by which the inner metallization layer of the corresponding insulating substrate is electrically connected to the outer metallization layer of the corresponding insulating substrate.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
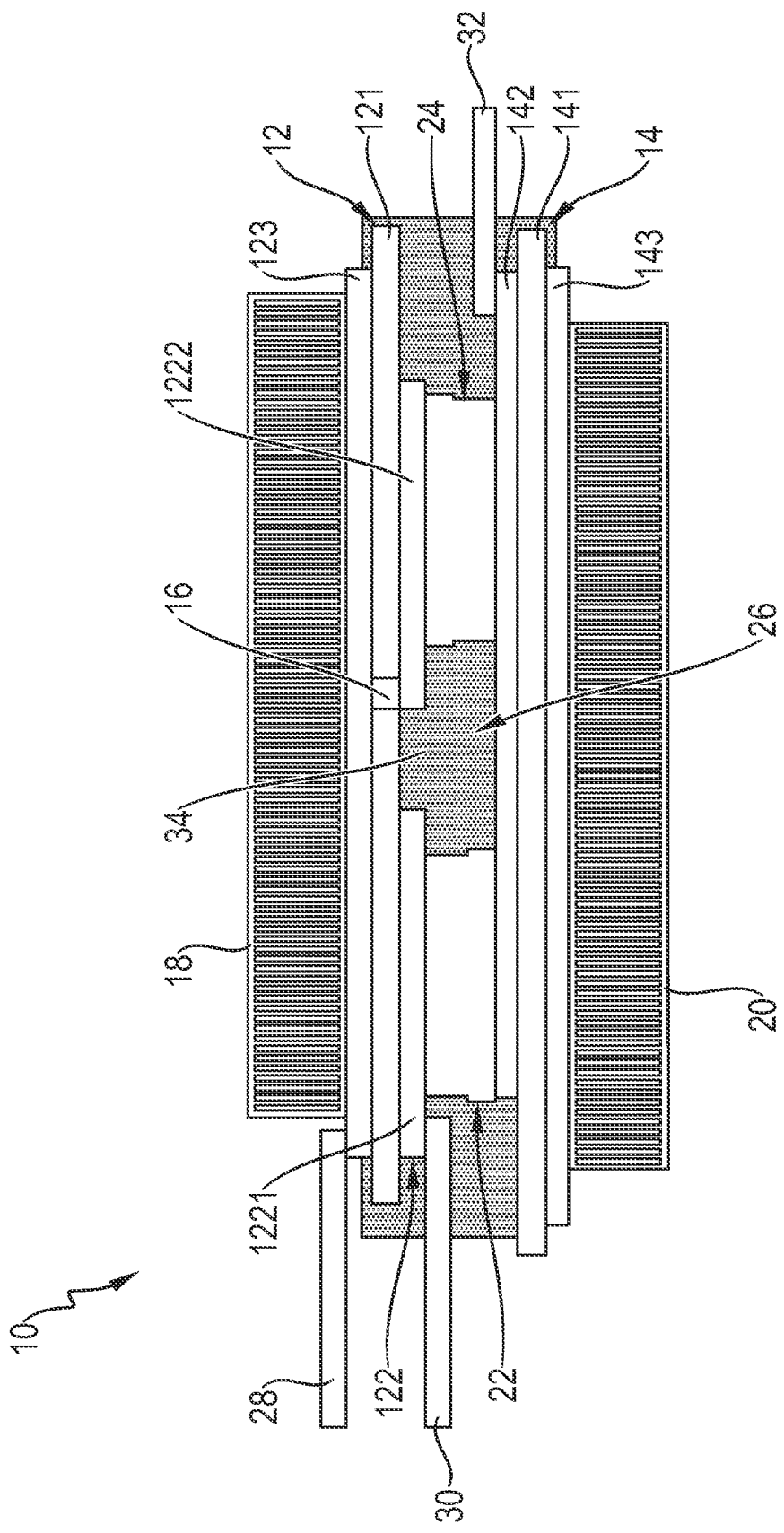
FIG. 1 shows a schematic representation of a first exemplary embodiment of a power semiconductor module according to the invention.

In an embodiment, the present invention provides a relatively compact, efficient and reliable power semiconductor module.

In an embodiment, a power semiconductor module comprises: a first insulating substrate, a second insulating substrate, which is arranged parallel to the first insulating substrate and at a distance from the first insulating substrate, the first insulating substrate and the second insulating substrate each comprising an insulating layer, an inner metallization layer which is arranged on an inner side, facing toward the other respective insulating substrate, of the insulating layer, and an outer metallization layer which is arranged on an outer side, facing away from the other respective insulating substrate, of the insulating layer, a first cooling device, which is arranged thermally conductively on the outer metallization layer of the first insulating substrate, a second cooling device, which is arranged thermally conductively on the outer metallization layer of the second insulating substrate, and a power semiconductor element, which is arranged between the first insulating substrate and the second insulating substrate and is electrically and thermally connected to the inner metallization layer of the first insulating substrate and to the inner metallization layer of the second insulating substrate.

The power semiconductor module according to an embodiment of the invention comprises a first insulating substrate and a second insulating substrate, which is arranged parallel to the first insulating substrate and at a distance from the first insulating substrate. The two insulating substrates each comprise an insulating layer, an inner metallization layer which is arranged on an inner side, facing toward the other respective insulating substrate, of the insulating layer, and an outer metallization layer which is arranged on an outer side, facing away from the other respective insulating substrate, of the insulating layer. The two metallization layers of the insulating substrates in this case consist of a material having a relatively high electrical conductivity and a relatively high thermal conductivity, typically a metal, for example copper or aluminum. The insulating layer, conversely, consists of a material having a very low electrical conductivity but a relatively good thermal conductivity, typically a ceramic, for example aluminum oxide, beryllium oxide, aluminum nitride or sapphire, or a polymer filled with ceramic powder. Such insulating substrates may for example be so-called direct bond copper substrates (DBC substrates), active metal brazed substrates (AMB substrates) or insulated metal substrates (IMS).

The power semiconductor module according to an embodiment of the invention furthermore comprises two cooling devices, a first cooling device being arranged thermally conductively on the outer metallization layer of the first insulating substrate and a second cooling device being arranged thermally conductively on the outer metallization layer of the second insulating substrate. The cooling devices are typically formed as a solid heat sink which is arranged in direct surface contact with the corresponding outer metallization layer. Typically, the cooling devices consist of a metal and have a multiplicity of cooling fins, or comparable cooling structures, on their side facing away from the insulating substrate.

The power semiconductor module according to an embodiment of the invention furthermore comprises at least one power semiconductor element, which is arranged between the first insulating substrate and the second insulating substrate and is electrically and thermally connected to the inner metallization layer of the first insulating substrate and to the inner metallization layer of the second insulating substrate. The power semiconductor element generally comprises at least one semiconductor switch, for example a metal oxide semiconductor field-effect transistor (MOSFET), an insulated-gate bipolar transistor (IGBT) or a so-called high electron mobility transistor (HEMT). Typically, the power semiconductor element comprises a multiplicity of semiconductor switches connected electrically in parallel.

According to an embodiment of the invention, at least one of the two insulating substrates comprises a through-contact element which extends through the insulating layer of the corresponding insulating substrate and by means of which the inner metallization layer of the corresponding insulating substrate is electrically connected to the outer metallization layer of the corresponding insulating substrate. The through-contact element may, for example, consist of a silver paste or a copper paste which has been introduced into a through-hole formed in the insulating substrate and subsequently sintered. In principle, however, the through-contact element may consist of any desired electrically conductive material and be produced in any desired way.

By means of the through-contact element, an electrical connection between the inner metallization layer of the insulating substrate and the outer metallization layer of the insulating substrate is provided, so that both metallization layers of this insulating substrate are available in order to form the interconnection of the individual components of the power semiconductor module. This means that with the same insulating substrate size—in comparison with a power semiconductor module known from the prior art—approximately two times as much overall metallization area is available on the insulating substrate having the through-contact element in order to form the interconnection. In this way, relatively complex interconnections may be produced on a relatively small insulating substrate, while at the same time sufficient cooling of the power semiconductor elements can be ensured by means of the cooling devices, in particular by means of a dielectric coolant which flows around the cooling devices. Furthermore, a particularly low-inductance circuit layout may be achieved by using the two parallel metallization layers of the insulating substrate. This makes it possible to produce a relatively compact, efficient and reliable power semiconductor module.

Preferably, an intermediate space formed between the first insulating substrate and the second insulating substrate is filled, preferably fully, with an electrically nonconductive material, for example a dielectric encapsulation compound, in order to electrically insulate the two insulating substrates reliably from one another. This creates a particularly reliable power semiconductor module.

Typically, the power semiconductor module according to an embodiment of the invention comprises at least one terminal element for the external electrical contacting of the power semiconductor module. Preferably, a terminal element is arranged on the outer metallization layer of an insulating substrate that comprises a through-contact element according to an embodiment of the invention, and is electrically connected to the corresponding outer metallization layer. Because the terminal element is arranged on the outer metallization layer of the insulating substrate, the terminal element may be configured and arranged relatively freely. This makes it possible to produce a particularly compact power semiconductor module having a particularly low-inductance circuit layout.

Typically, the power semiconductor module according to an embodiment of the invention comprises two DC voltage terminal elements, which are formed in order to be connected to two DC voltage potentials of a DC voltage source. These two DC voltage terminal elements are often also referred to as DC+ and DC− terminals of the power semiconductor module. Preferably, the terminal element arranged on the outer metallization layer of the insulating substrate is a first DC voltage terminal element, which is configured to be connected to a first DC voltage potential of a DC voltage source, and a second DC voltage terminal element is additionally provided, which is configured to be connected to a second DC voltage potential of the DC voltage source.

Preferably, the second DC voltage terminal element is arranged on the inner metallization layer of that insulating substrate on whose outer metallization layer the first DC voltage terminal element is arranged, and is electrically connected to the corresponding inner metallization layer. This makes it possible to arrange the two DC voltage terminal elements above one another, so that a particularly compact power semiconductor module having a particularly low-inductance DC voltage connection may be produced.

Preferably, the second DC voltage terminal element extends substantially parallel to the first DC voltage terminal element. Advantageously, the DC voltage terminal elements are in this case formed as two-dimensional elements and are arranged above one another in such a way that the DC voltage terminal elements face one another in a large-area region at a relatively small distance. This generates a relatively strong inductive coupling between the two DC voltage terminal elements, so that a particularly low-inductance DC voltage terminal may be produced. This makes it possible to produce a particularly efficient power semiconductor module having a relatively high switching speed.

Preferably, the power semiconductor module comprises a third insulating substrate as well as a further power semiconductor element. The third insulating substrate is in this case arranged in a plane with the first insulating substrate, that is to say "next to" the first insulating substrate, and consequently parallel to and at a distance from the second insulating substrate. The third insulating substrate is constructed substantially similarly to the first insulating substrate and the second insulating substrate, that is to say it likewise comprises an insulating layer, an inner metallization layer and an outer metallization layer. The inner metallization layer is in this case arranged on an inner side, facing toward the second insulating substrate, of the insulating layer and the outer metallization layer is arranged on an outer side, facing away from the second insulating substrate, of the insulating layer, and bears thermally conductively on the first cooling device. The further power semiconductor element is arranged between the third insulating substrate and the second insulating substrate, and is electrically and thermally connected to the inner metallization layer of the third insulating substrate and to the inner metallization layer of the second insulating substrate. The two power semiconductor elements of the power semiconductor module are thus both contacted by the same insulating substrate on a first side, but on the opposite second side they are respectively contacted by a separate insulating substrate. This allows relatively simple production of the power semiconductor module.

Preferably, the power semiconductor module comprises a contact element which electrically connects the inner metallization layer of the third insulating substrate to the inner metallization layer of the second insulating substrate. This makes it possible to interconnect the two power semiconductor elements with one another in a straightforward way in a so-called half-bridge circuit.

Two exemplary embodiments of the present invention will be explained below with the aid of the appended drawings, in which FIG. 1 shows a power semiconductor module 10 according to an embodiment of the invention having a first insulating substrate 12 and a second insulating substrate 14, which is arranged parallel to and at a distance from the first insulating substrate 12.

The first insulating substrate 12 comprises an insulating layer 121, an inner metallization layer 122 which is arranged on an inner side, facing toward the second insulating substrate 14, of the insulating layer 121, and an outer metallization layer 123 which is arranged on an outer side, facing away from the second insulating substrate 14, of the insulating layer 121. The inner metallization layer 122 of the first insulating substrate 12 comprises a first metallization region 1221 and a second metallization region 1222, which is electrically insulated from the first metallization region 1221.

The first insulating substrate 12 comprises a through-contact element 16, which extends through the insulating layer 121 of the first insulating substrate 12 and provides an electrical connection between the second metallization region 1222 of the inner metallization layer 122 of the first insulating substrate 12 and the outer metallization layer 123 of the first insulating substrate 12.

The second insulating substrate 14 comprises an insulating layer 141, an inner metallization layer 142 which is arranged on an inner side, facing toward the first insulating substrate 12, of the insulating layer 141, and an outer metallization layer 143 which is arranged on an outer side, facing away from the first insulating substrate 12, of the insulating layer 141.

The power semiconductor module 10 comprises a first cooling device 18, which is arranged thermally conductively on the outer metallization layer 123 of the first insulating substrate 12, and a second cooling device 20, which is arranged thermally conductively on the outer metallization layer 143 of the second insulating substrate 14. The two cooling devices 18,20 are each in direct large-area contact via their inner side with the corresponding outer metallization layer 123,143 in order to allow efficient heat transfer from the outer metallization layer 123,143 into the cooling device 18,20.

The power semiconductor module 10 comprises a first power semiconductor element 22 and a second power semiconductor element 24, which are arranged in an intermediate space 26 formed between the two insulating substrates 12,14. The first power semiconductor element 22 is electrically and thermally connected on the input side to the inner metallization layer 142 of the second insulating substrate 14, and is electrically and thermally connected on the output side to the first metallization region 1221 of the inner metallization layer 122 of the first insulating substrate 12. The second power semiconductor element 24 is electrically and thermally connected on the input side to the second metallization region 1222 of the inner metallization layer 122 of the first insulating substrate 12, and is electrically and thermally connected on the output side to the inner metallization layer 142 of the second insulating substrate 14.

The power semiconductor module 10 comprises three terminal elements 28,30,32 for the external electrical contacting of the power semiconductor module 10. The first terminal element 28 is a first DC voltage terminal element, which is configured to be connected to a first DC voltage potential of a DC voltage source. The first terminal element 28 is arranged on the outer metallization layer 123 of the first insulating substrate 12 and is electrically connected to the outer metallization layer 123 of the first insulating substrate 12. The first terminal element 28 is thus electrically connected by means of the outer metallization layer 123 of the first insulating substrate 12, the through-contact element 16 and the second metallization region 1222 of the inner metallization layer 122 of the first insulating substrate 12 to the input of the second power semiconductor element 24.

The second terminal element 30 is a second DC voltage terminal element, which is configured to be connected to a second DC voltage potential of the DC voltage source. The second terminal element 30 is arranged on the first metallization region 1221 of the inner metallization layer 122 of the first insulating substrate 12 and is electrically connected to the first metallization region 1221 of the inner metallization layer 122 of the first insulating substrate 12. The second terminal element 30 is thus electrically connected by means of the first metallization region 1221 of the inner metallization layer 122 of the first insulating substrate 12 to the output of the first power semiconductor element 22. The second terminal element 30 extends substantially parallel to the first terminal element 28.

The third terminal element 32 is arranged on the inner metallization layer 142 of the second insulating substrate 14 and is electrically connected to the inner metallization layer 142 of the second insulating substrate 14. The third terminal element 32 is thus electrically connected by means of the inner metallization layer 142 of the second insulating substrate 14 both to the output of the second power semiconductor element 24 and to the input of the first power semiconductor element 22.

The intermediate space 26 of the power semiconductor module 10 is filled with an encapsulation compound 34, which consists of an electrically nonconductive material.

Figure 2:
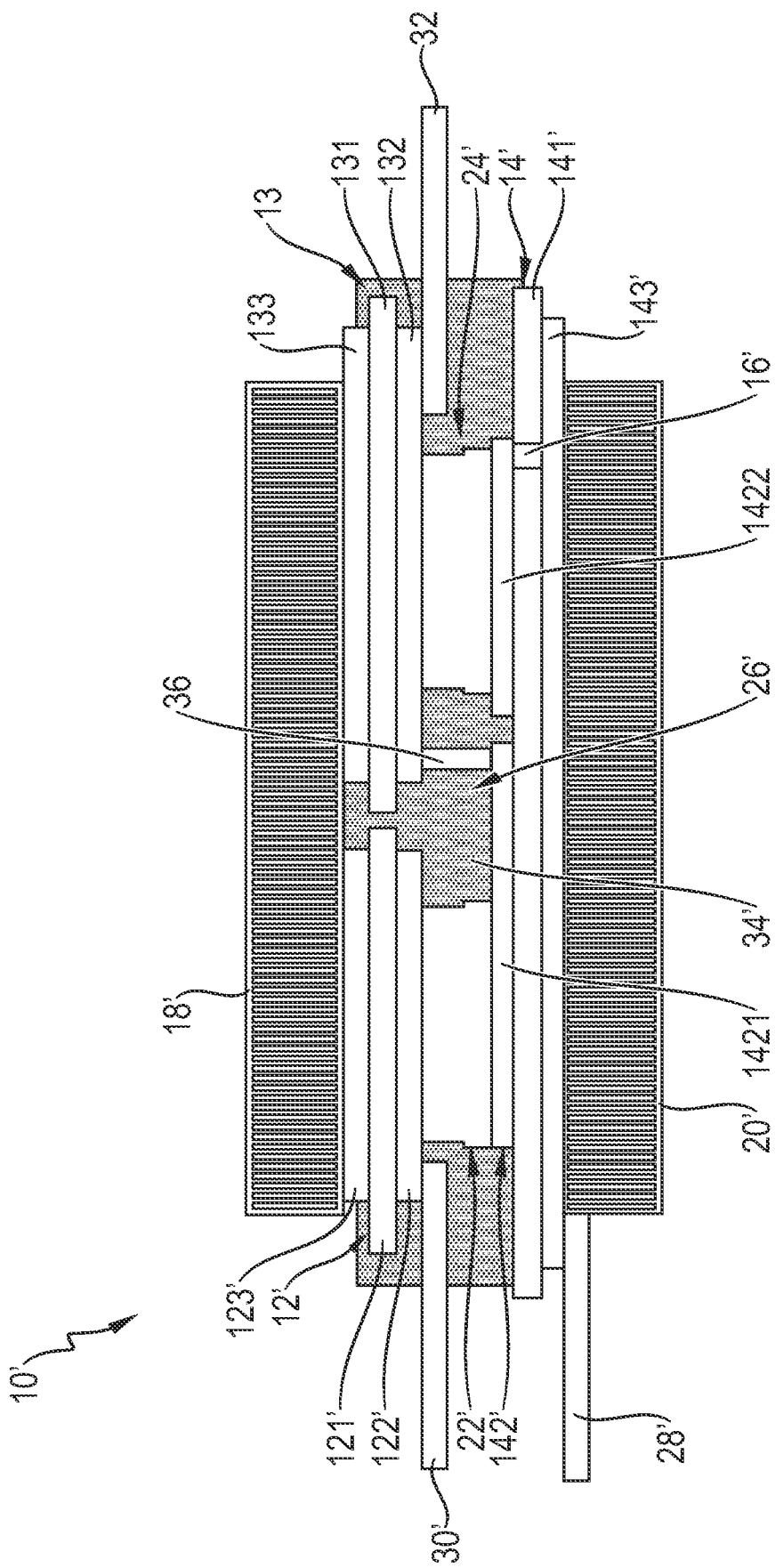
FIG. 2 shows a schematic representation of an alternative second exemplary embodiment of a power semiconductor module according to the invention.

FIG. 2 shows an alternative power semiconductor module 10' according to an embodiment of the invention, the corresponding references from FIG. 1 being used with a suffixed apostrophe in order to denote features known already from the power semiconductor module 10.

The power semiconductor module 10' comprises a third insulating substrate 13, which is arranged next to the first insulating substrate 12' and in a plane with the first insulating substrate 12'. The third insulating substrate 13 is thus arranged parallel to and at a distance from the second insulating substrate 14'. The third insulating substrate 13 comprises an insulating layer 131, an inner metallization layer 132 which is arranged on an inner side, facing toward the second insulating substrate 14', of the insulating layer 131, and an outer metallization layer 133 which is arranged on an outer side, facing away from the second insulating substrate 14', of the insulating layer 131 and bears thermally conductively on the first cooling device 18'.

The inner metallization layer 142' of the second insulating substrate 14 comprises a first metallization region 1421 and a second metallization region 1422, which is electrically insulated from the first metallization region 1421.

The through-contact element 16' extends through the insulating layer 141' of the second insulating substrate 14' and provides an electrical connection between the second metallization region 1422 of the inner metallization layer 142' of the second insulating substrate 14' and the outer metallization layer 143' of the second insulating substrate 14'.

The power semiconductor module 10' comprises a contact element 36, which is arranged between the inner metallization layer 132 of the third insulating substrate 13 and the first metallization region 1421 of the inner metallization layer 142' of the second insulating substrate 14' and electrically connects the inner metallization layer 132 of the third insulating substrate 13 to the first metallization region 1421 of the inner metallization layer 142' of the second insulating substrate 14'.

The first power semiconductor element 22' is electrically and thermally connected on the input side to the first metallization region 1421 of the inner metallization layer 142' of the second insulating substrate 14', and is electrically and thermally connected on the output side to the inner metallization layer 122' of the first insulating substrate 12'. The second power semiconductor element 24' is electrically and thermally connected on the input side to the second metallization region 1422 of the inner metallization layer 142' of the second insulating substrate 14', and is electrically and thermally connected on the output side to the inner metallization layer 132 of the third insulating substrate 13.

The first terminal element 28' is arranged on the outer metallization layer 143' of the second insulating substrate 14' and is electrically connected to the outer metallization layer 143' of the second insulating substrate 14'. The first terminal element 28' is thus electrically connected by means of the outer metallization layer 143' of the second insulating substrate 14', the through-contact element 16' and the second metallization region 1422 of the inner metallization layer 142' of the second insulating substrate 14' to the input of the second power semiconductor element 24'.

The second terminal element 30' is arranged on the inner metallization layer 122' of the first insulating substrate 12' and is electrically connected to the inner metallization layer 122' of the first insulating substrate 12'. The second terminal element 30' is thus electrically connected by means of the inner metallization layer 122' of the first insulating substrate 12' to the output of the first power semiconductor element 22'. The second terminal element 30' extends substantially parallel to the first terminal element 28'.

The third terminal element 32' is arranged on the inner metallization layer 132 of the third insulating substrate 13 and is electrically connected to the inner metallization layer 132 of the third insulating substrate 13. The third terminal element 32' is thus electrically connected by means of the inner metallization layer 132 of the third insulating substrate 13 to the output of the second power semiconductor element 24', and is furthermore electrically connected by means of the contact element 36 and the first metallization region 1421 of the inner metallization layer 142' of the second insulating substrate 14' to the input of the first power semiconductor element 22'.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A power semiconductor module comprising:
a first insulating substrate;
a second insulating substrate, which is arranged parallel to the first insulating substrate and at a distance from the first insulating substrate, the first insulating substrate and the second insulating substrate each comprising:
an insulating layer,
an inner metallization layer which is arranged on an inner side, facing toward an other respective insulating substrate, of the insulating layer, and an outer metallization layer which is arranged on an outer side, facing away from the other respective insulating substrate, of the insulating layer;
a first cooling device, which is arranged thermally conductively on the outer metallization layer of the first insulating substrate;
a second cooling device, which is arranged thermally conductively on the outer metallization layer of the second insulating substrate; and
a power semiconductor, which is arranged between the first insulating substrate and the second insulating substrate and is electrically and thermally connected to the inner metallization layer of the first insulating substrate and to the inner metallization layer of the second insulating substrate,
wherein
at least one of the two insulating substrates comprise a through-contact, which extends through the insulating layer of a corresponding insulating substrate and by which the inner metallization layer of the corresponding insulating substrate is electrically connected to the outer metallization layer of the corresponding insulating substrate.

2. The power semiconductor module as claimed in claim 1, wherein an intermediate space formed between the first insulating substrate and the second insulating substrate is filled with an electrically nonconductive material.

3. The power semiconductor module as claimed in claim 1, comprising a terminal for the external electrical contacting of the power semiconductor module, wherein the terminal is arranged on the outer metallization layer of that insulating substrate which comprises the through-contact, and is electrically connected to the corresponding outer metallization layer.

4. The power semiconductor module as claimed in claim 3, wherein the terminal is a first DC voltage terminal, which is configured to be connected to a first DC voltage potential of a DC voltage source, and wherein a second DC voltage terminal is provided, which is configured to be connected to a second DC voltage potential of the DC voltage source and which is arranged on the inner metallization layer of that insulating substrate on which the first DC voltage terminal is arranged, and is electrically connected to the corresponding inner metallization layer.

5. The power semiconductor module as claimed in claim 3, wherein the terminal is a first DC voltage terminal, which is configured to be connected to a first DC voltage potential of a DC voltage source, and wherein a second DC voltage terminal is provided, which is configured to be connected to a second DC voltage potential of the DC voltage source and which extends substantially parallel to the first DC voltage terminal.

6. The power semiconductor module as claimed in claim 1, comprising:
a third insulating substrate, which is arranged in a plane with the first insulating substrate, the third insulating substrate comprising:
an insulating layer,
an inner metallization layer which is arranged on an inner side, facing toward the second insulating substrate, of the insulating layer, and
an outer metallization layer which is arranged on an outer side, facing away from the second insulating substrate, of the insulating layer and bears thermally conductively on the first cooling device; and
a further power semiconductor, which is arranged between the third insulating substrate and the second insulating substrate and is electrically and thermally connected to the inner metallization layer of the third insulating substrate and to the inner metallization layer of the second insulating substrate.

7. The power semiconductor module as claimed in claim 6, comprising a contact which electrically connects the inner metallization layer of the third insulating substrate to the inner metallization layer of the second insulating substrate.

* * * * *